United States Patent [19]

Ishii

[11] 4,262,218
[45] Apr. 14, 1981

[54] SIGNAL SWITCH CIRCUIT FOR PLURAL ANALOG SIGNALS

[75] Inventor: Jun Ishii, Yokohama, Japan

[73] Assignee: Tokyo Shibaura Denki Kabushiki Kaisha, Kawasaki, Japan

[21] Appl. No.: 11,922

[22] Filed: Feb. 13, 1979

[30] Foreign Application Priority Data

Feb. 20, 1978 [JP] Japan .................. 53/18380

[51] Int. Cl.³ .......................................... H03K 17/00
[52] U.S. Cl. ................................. 307/255; 307/241; 307/288; 330/261
[58] Field of Search ............... 307/255, 241, 288; 330/119, 261

[56] References Cited

U.S. PATENT DOCUMENTS

| | | | |
|---|---|---|---|
| 2,596,104 | 3/1952 | King | 330/119 |
| 3,660,773 | 5/1972 | Free | 330/261 |
| 3,737,797 | 6/1973 | Amemiya | 330/261 |

Primary Examiner—Stanley D. Miller, Jr.
Assistant Examiner—B. P. Davis
Attorney, Agent, or Firm—Cushman, Darby & Cushman

[57] ABSTRACT

A signal switch circuit which comprises a first emitter follower transistor supplied with an input signal of a first channel, and a second emitter follower transistor supplied an input signal of a second channel. The collectors of the first and second emitter follower transistors are connected to a positive power source through first and second switch circuits. The first and second switch circuits are established or interrupted in accordance with the D.C. level of a control potential. The first and second emitter follower transistors produce an output signal corresponding to any of the input signals, according as the first and second switch circuits are established or interrupted.

6 Claims, 7 Drawing Figures

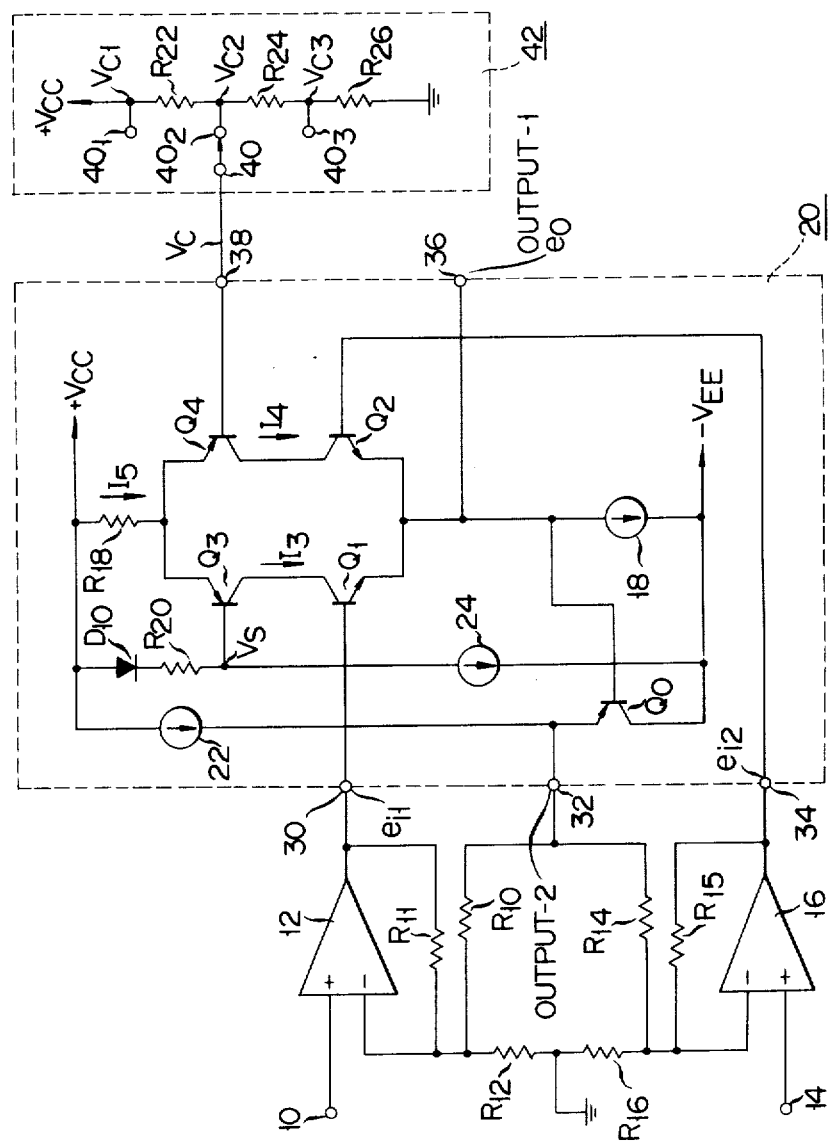
F I G. 2

F I G. 5
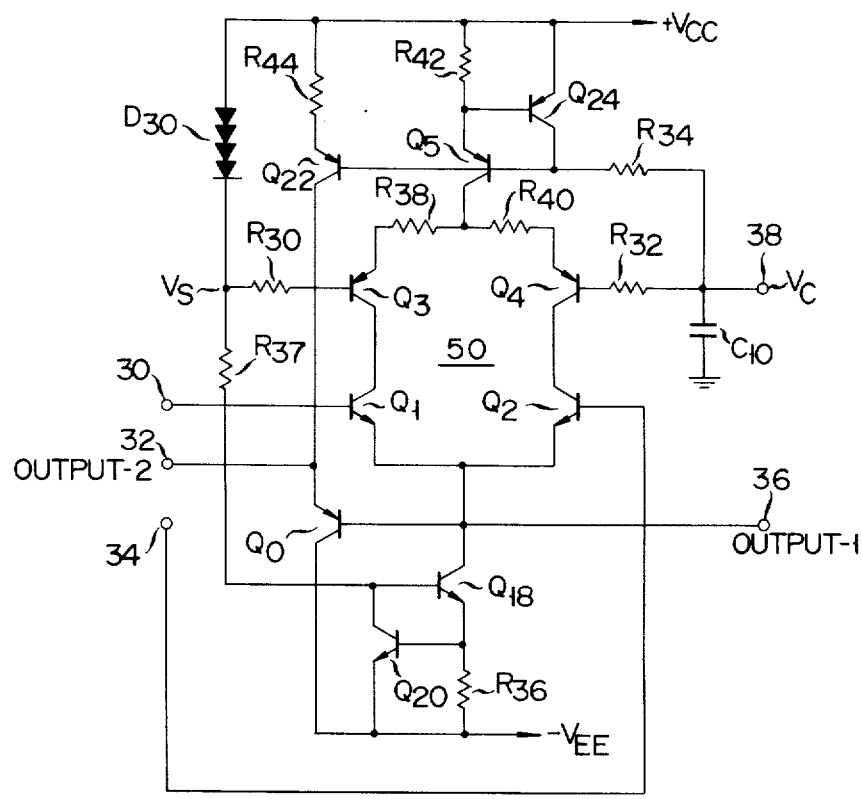

F I G. 6
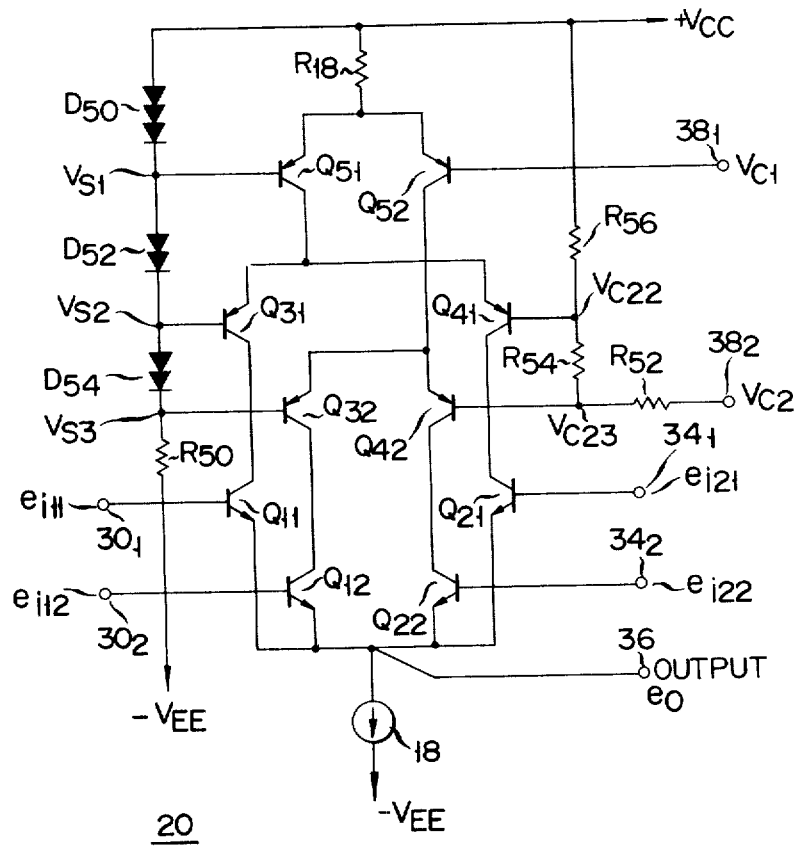

SIGNAL SWITCH CIRCUIT FOR PLURAL ANALOG SIGNALS

This invention relates to a signal switch circuit for changing over or mixing a plurality of analog signals, for example, audio signals.

A known electronic switch circuit for changing over or mixing a plurality of analog signals includes, for example, a switch circuit set forth in the U.S. Pat. No. 3,875,552. An attenuator circuit disclosed in said patent is adapted for integration, and can also function as an analog switch circuit. However, said switch circuit has the drawbacks that there is a wide difference between the D.C. levels at the input and output terminals; an output signal is drawn off from a collector circuit using a source of constant current as a load, thus raising the output impedance; and where, therefore, said switch circuit is connected to another electronic circuit, it becomes necessary to use a D.C. level shift, D.C. blocking capacitor or impedance converter.

It is the object of this invention to provide a signal switch circuit in which the difference between the D.C. levels at the input and output terminals is reduced and which has such arrangement as is adapted for integration.

To this end, this invention provides a signal switch circuit including signal switch elements controlled by a control signal, characterized in that said signal switch elements comprise a first transistor, whose base is supplied with an input signal, and whose emitter issues an output signal; a second transistor whose base is supplied with a second input signal and whose emitter sends forth said output signal; a first switch circuit which is connected between the collector of the first transistor and a first power source, and established or interrupted in accordance with the D.C. level of a control signal; a second switch circuit which is connected between the collector of the second transistor and the first power source, and established or interrupted in accordance with the D.C. level of the control signal; and a first impedance which is connected between a second power source on one hand and the emitters of the first and second transistors on the other.

A signal switch circuit embodying this invention which is arranged as described above has the following features:

(1) The signal switch circuit is formed of the emitter follower type, thereby reducing the difference between the D.C. levels at the input and output terminals and also the output impedance;

(2) Switching is carried out on the collector circuit of the emitter follower transistor. Even if, therefore, the switching means is nonlinear, the switched analog signal is not distorted. Further, even if the switching means is accompanied with noise, the output signal is little affected by; and (3) The switching means can be controlled by a single D.C. signal. Not only the changeover of signals but also their mixture is made possible in accordance with the level of said D.C. signal used for control.

This invention can be more fully understood from the following detailed description when taken in conjunction with the accompanying drawings, in which:

FIG. 1 shows the schematic fundamental arrangement of a signal switch circuit embodying this invention;

FIG. 2 indicates the concrete arrangement of FIG. 1;

Figure 3:
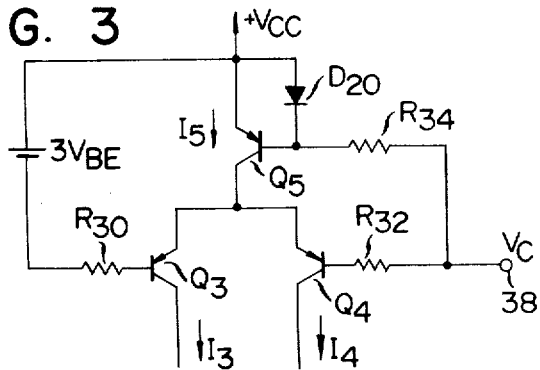
FIG. 3 is a fractional diagram of a signal switch circuit modified from that of FIG. 2.
Figure 4A:
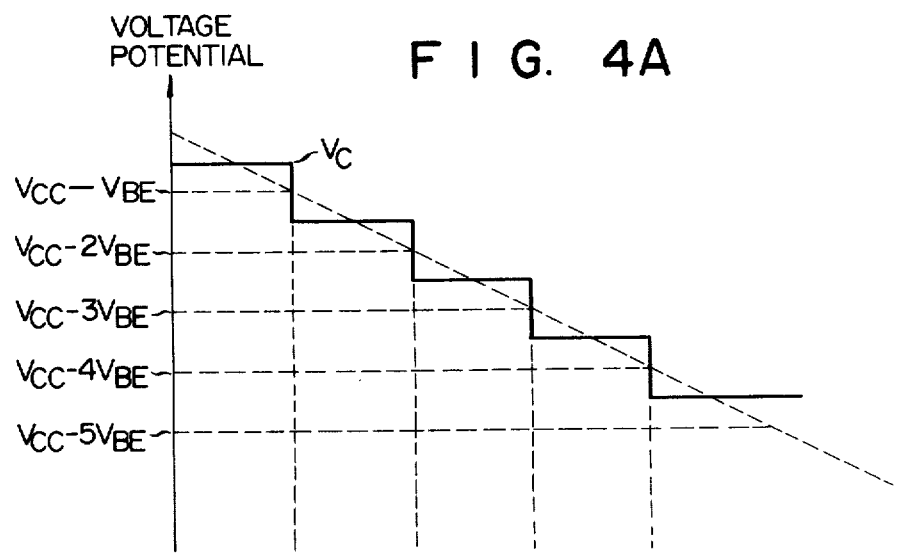
FIG. 4A is a diagram of the D.C. levels of a control potential $V_C$ impressed on the signal switch circuit of FIG. 3.
Figure 4B:
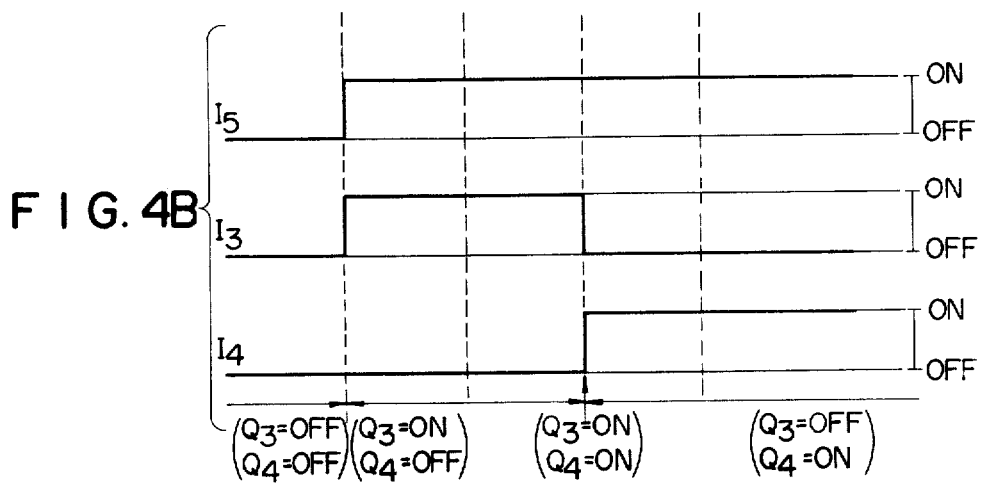

FIG. 4B indicates relationship between the D.C. levels shown in FIG. 4A and the magnitudes of current running through the signal switch circuit of FIG. 3;

FIG. 5 shows the arrangement of a signal switch circuit modified from that of FIG. 2; and FIG. 6 is another modification of the signal switch circuit of FIG. 2.

There will now be described by reference to the accompanying drawing the preferred embodiments of a signal switch circuit of this invention. For briefness, the same or similar parts are denoted by the same or similar numerals throughout the embodiments.

Figure 1:
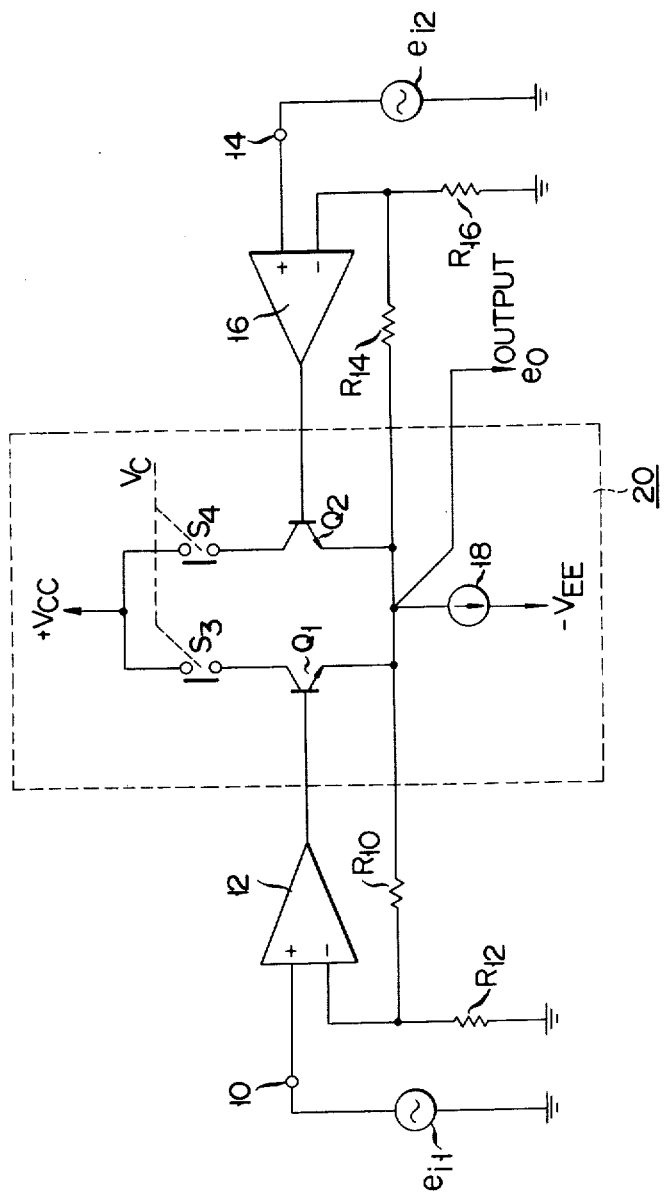

FIG. 1 shows the fundamental arrangement of a signal switch circuit embodying this invention. A first input signal $e_{i1}$ is supplied through a terminal 10 to the noninverted input terminal of a first amplifier 12, whose output terminal is connected to the base of a first NPN transistor $Q_1$. A second input signal $e_{i2}$ is conducted through a terminal 14 to the noninverted input terminal of a second amplifier 16 whose output terminal is connected to the base of the second NPN transistor $Q_2$. The emitters of the first and second transistors $Q_1$, $Q_2$ are connected to a negative power source $-V_{EE}$ through a first current source 18. The emitter of the first transistor $Q_1$ is connected through a resistor $R_{10}$ to the inverted input terminal of the amplifier 12. This inverted input terminal is grounded through a resistor $R_{12}$. The emitter of the second transistor $Q_2$ is connected through a resistor $R_{14}$ to the inverted inut terminal of the amplifier 16. Said inverted input terminal is grounded through a resistor $R_{16}$. An output signal $e_0$ is issued from the emitters of the first and second transistors $Q_1$, $Q_2$.

The collectors of the first and second transistors $Q_1$, $Q_2$ are connected to a positive power source $+V_{CC}$ through corresponding switches $S_3$, $S_4$, respectively. The first and second transistors $Q_1$, $Q_2$, switches $S_3$, $S_4$ and first current source 18 collectively constitute a signal switch circuit 20.

The switches $S_3$, $S_4$ are opened or closed in accordance with the D.C. level of a control voltage $V_C$, namely, a control potential $V_C$. Where the switch $S_3$ alone is rendered conducting, a first emitter follower transistor $Q_1$ is put into operation. At this time, the output signal $e_0$ is expressed as $k\, e_{i1}$ corresponding to the first input signal $e_{i1}$. The charactor k denotes a proportion constant corresponding to a gain in the closed loop of the amplifiers 12, 16. Where the switch $S_4$ alone is operated, the output signal $e_0$ is expressed as $k\, e_{i2}$ corresponding to the second input signal $e_{i2}$. Where both switches $S_3$, $S_4$ are thrown in, the output signal $e_0$ is issued in the form of $k\,(e_{i1}+e_{i2})$. Where the switches $S_3$, $S_4$ are rendered nonconducting, no output signal is produced.

Now let it be assumed that the control potential $V_C$ may take any of the four levels $V_{C1}$, $V_{C2}$, $V_{C3}$, $V_{C4}$. Then the control potential $V_C$ and the ON and OFF mades of the switches $S_3$, $S_4$ have such relationship as is set forth in Table 1 below.

TABLE 1

| $V_C$ | $S_3$ | $S_4$ | $e_0$ |
|---|---|---|---|
| $V_{C1}$ | OFF | OFF | — |
| $V_{C2}$ | ON | OFF | $k\, e_{i1}$ |

TABLE 1-continued

| $V_C$ | $S_3$ | $S_4$ | $e_0$ |
|---|---|---|---|
| $V_{C3}$ | OFF | ON | $k\,e_{i2}$ |
| $V_{C4}$ | ON | ON | $k(e_{i1}+e_{i2})$ |

FIG. 2 shows the concrete arrangement of the signal switch circuit of FIG. 1. The output terminal of an amplifier 12 is connected through a resistor $R_{11}$ to the inverted input terminal of said amplifier 12. This inverted input terminal is grounded through a resistor $R_{12}$. The noninverted input terminal of the amplifier 12 is connected to the input terminal 10. The output terminal of an amplifier 16 is connected through a resistor $R_{15}$ to the inverted input terminal of said amplifier 16. This inverted input terminal is grounded through a resistor $R_{16}$. The noninverted input terminal of the amplifier 16 is connected to the input terminal 14. The output terminal of the amplifier 12 is connected through a terminal 30 to the base of a first NPN transistor $Q_1$. The output terminal of the amplifier 16 is connected through a terminal 34 to the base of a second NPN transistor $Q_2$. The emitters of the first and second transistors $Q_1$, $Q_2$ are connected through the first current source 18 to the negative power source $-V_{EE}$. The emitters of the first and second transistors $Q_1$, $Q_2$ are also connected to a first output terminal 36.

The emitters of the first and second transistors $Q_1$, $Q_2$ are connected to the base of a PNP transistor $Q_0$. The collector of said PNP transistor $Q_0$ is connected to the negative power source $-V_{EE}$. The emitter of the PNP transistor $Q_0$ connected through a second current source 22 to a positive power source $+V_{CC}$. The collectors of the first and second transistors $Q_1$, $Q_2$ are connected to the collectors of PNP transistors $Q_3$, $Q_4$ respectively. The emitters of the transistors $Q_3$, $Q_4$ are connected through a resistor $R_{18}$ to the positive power source $+V_{CC}$. The base of the transistor $Q_3$ is connected through a resistor $R_{20}$ to the cathode of a bias diode $D_{10}$. The anode of the bias diode $D_{10}$ is connected to the positive power source $+V_{CC}$. The base of transistor $Q_3$ is connected to the negative power source $-V_{EE}$ through a third current source 24. The base of the transistor $Q_4$ is connected to a terminal 38, which is supplied with a control potential $V_C$. The transistors $Q_1$ to $Q_4$, current sources 18 to 24, resistors $R_{18}$, $R_{20}$ and bias diode $D_{10}$ jointly constitute a signal switch circuit 20.

The emitter of the transistor $Q_0$ is connected to a second output terminal 32, which is connected through the resistors $R_{10}$, $R_{14}$ to the inverted input terminals of the amplifiers 12, 16. In the amplifiers 12, 16 the resistors $R_{11}$, $R_{14}$ constitute the negative feedback of a minor loop. The negative feedback of the minor loop is provided primarily for the following to reasons (1) The negative feedback reduces an impedance which occurs in driving the first and second transistors $Q_1$, $Q_2$. A drop in the base side impedance of the transistors $Q_1$, $Q_2$ ensures a sufficient fall in the emitter impedance of said transistors $Q_1$, $Q_2$.

(2) Where the first and second transistors $Q_1$, $Q_2$ cut off, the negative feedback suppresses a gain in the corresponding amplifiers 12, 16. Where an unduly large gain arises in the open loop of the amplifiers 12, 16 due to the absence of the negative feedback of the minor loop produced by the resistors $R_{11}$, $R_{15}$, and in this case the collector circuits of the transistors $Q_1$, $Q_2$ are cut off from the positive power source $+V_{CC}$, then a distorted signal resulting from a diode action occurring across the base-emitter regions of the transistors $Q_1$, $Q_2$ appears in the emitters of said transistors $Q_1$, $Q_2$.

Where, therefore, the open loops of the amplifiers 12, 16 have a small gain, the negative feedback of the minor loop need not be provided.

The terminal 38 is connected to the slider of a switch 40. The contactors $40_1$, $40_2$ of the switch 40 are connected together by means of a resistor $R_{22}$. The contactors $40_2$, $40_3$ of said switch 40 are connected together by means of a resistor $R_{24}$. The contactor $40_1$ is connected to the positive power source $+V_{CC}$, and the contactor $40_3$ is grounded through a resistor $R_{26}$. The contactors $40_1$, $40_2$, $40_3$ are respectively impressed with control potentials $V_{C1}$, $V_{C2}$, $V_{C3}$. The switch 40 and the resistors $R_{22}$ to $R_{26}$ jointly constitute switch means 42.

With $V_S$ taken to denote the base potential (for comparison) of the third transistor $Q_3$, assume $V_{C1} > V_{C2} = V_S > V_{C3}$. Where, under this condition, the slider 40 contacts the contactor $40_1$, namely, in the case of $V_C = V_{C1}$, then the third transistor $Q_3$ is rendered conducting and the fourth transistor $Q_4$ remains inoperative. At this time, the first transistor $Q_1$ is put into operation, and the second transistor $Q_2$ is cut off. Thus a signal supplied to the input terminal 10 is brought as an output signal to the output terminal 36 or 32.

While the slider 40 is in contact with the contactor $40_2$, namely, in the case of $V_C = V_{C2}$, both transistors $Q_3$, $Q_4$ are rendered conducting. At this time, the transistors $Q_1$, $Q_2$ are also put into operation. In other words, a sum of signals supplied to the input terminals 10, 14 is sent forth from the output terminal 36 or 32.

While the slider 40 is in contact with the contactor $40_3$, namely, in the case of $V_C = V_{C3}$, the transistor $Q_3$ remains inoperative, and the transistor $Q_4$ is rendered conducting. At this time, the transistor $Q_2$ is put into operation, and the transistor $Q_1$ is cut off. Thus, a signal supplied to the input terminal 14 is sent forth as an output signal from the output terminal 36 or 32. As mentioned above, the control potential $V_C$ supplied by the switching means 42 causes signals to be changed over or mixed together.

The signal switch circuit 20 of FIG. 2 is provided with two output terminals 36, 32, which are selectively used in accordance with the object for which the signal switch circuit 20 is intended. With $V_{BE}$ taken to denote the base-emitter threshold voltages of the transistors $Q_0$, $Q_1$, $Q_2$, assume that the amplifiers 12, 16 are designed for D.C. amplification. In this case, the terminals 30, 34 have substantially zero D.C. potential. Under this condition, the D.C. potential or D.C. level shift of the first output terminal 36 indicates about $-V_{BE}$, and the D.C. potential of the second output terminal 32 is substantially become to zero. With T taken to represent ambient temperature, the DC level shift at the output terminal 36 has a temperature coefficient or temperature drift expressed as $\partial V_{BE}/\partial T$ ($\simeq$ about 2 mV/°C.). Neither D.C. level shift nor temperature drift occurs at the output terminal 32. The reason for this event is that the base-emitter threshold voltage $V_{BE}$ and the temperature drift $\partial V_{BE}/\partial T$ of the transistors $Q_1$, $Q_2$ are offset by the $V_{BE}$ and $\partial V_{BE}/\partial T$ of the transistor $Q_0$. The first output terminal 36 is used when it is desired to positively provide a DC level shift having a magnitude of $V_{BE}$ and a temperature drift of $\partial V_{BE}/\partial T$ for another circuit (not shown) connected to the signal switch circuit 20, namely, when it is intended to carry out temperature compensation for said another circuit by the signal switch circuit 20. Except for the above-mentioned occasion, it is proper to use the second output terminal 32. Where, however, the subject signal switch circuit is connected to any other circuit (not shown) through a DC-blocking capacitor, then it is possible to use either of the output terminals 36, 32.

FIG. 3 is a fractional diagram of a signal switch circuit modified from that of FIG. 2. The emitters of PNP transistors $Q_3$, $Q_4$ are connected to the collector of a PNP transistor $Q_5$. The emitter of this transistor $Q_5$ is connected to the positive power source $+V_{CC}$. The emitter and base of said transistor $Q_5$ are connected to the anode and cathode of the bias diode $D_{20}$. The base of the transistor $Q_5$ is connected to the terminal 38 through a resistor $R_{34}$. The bias of the transistor $Q_4$ is connected to said terminal 38 through a resistor $R_{32}$. Said terminal 38 is supplied with a control potential $V_C$. The base of the transistor $Q_3$ is connected through a resistor $R_{30}$ to the negative electrode of the bias power source $3V_{BE}$, whose positive electrode is connected to the positive power source $+V_{CC}$. Thus, the base of the transistor $Q_3$ is chosen to have a potential of $V_{CC}-3V_{BE}$.

There will now be described by reference to FIGS. 4A and 4B the operation of a signal switch circuit of FIG. 3. FIG. 4A shows the D.C. levels of a control potential impressed on the terminal 38. FIG. 4B indicates agreement between the D.C. levels of FIG. 4A and the magnitudes of current running through the signal switch circuit of FIG. 3. Agreement between said D.C. levels and the ON and OFF modes of the transistors $Q_3$ to $Q_5$ is defined as follows:

(i) In case of $V_C > V_{CC}-V_{BE}$, the transistor $Q_5$ and consequently the transistors $Q_3$, $Q_4$ are rendered nonconducting.

(ii) In case of $V_{CC}-V_{BE} > V_C > V_{CC}-3V_{BE}$. The transistor $Q_5$ is put into operation. At this time, the transistor $Q_4$ remains inoperative, while the transistor $Q_3$ is turn on.

(iii) In case of $V_C = V_{CC}-3V_{BE}$, the transistor $Q_5$ is operated. At this time, the transistors $Q_3$, $Q_4$ have the same base potential, and are rendered conducting.

(iv) In case of $V_{CC}-3V_{BE} > V_C$, the transistor $Q_5$ is put into operation. At this time, the transistor $Q_4$ has a lower base potential than the transistor $Q_3$. In other words, the transistor $Q_3$ is rendered inoperative, while the transistor $Q_4$ is operated. Where the control potential $V_C$ is brought to any of the above-mentioned four states, then the transistors $Q_3$, $Q_4$ are rendered conducting or nonconducting, or either of them is operated. The transistors $Q_3$, $Q_4$ correspond to the switches $S_3$, $S_4$ of FIG. 1. The states described under the items of (ii), (iii), (iv) are realized by the signal switch circuit 20.

FIG. 5 shows the arrangement of a modification of the signal switch circuit 20 of FIG. 2. The embodiment of FIG. 5 fundamentally uses the circuit arrangement of FIG. 3. A terminal 30 is connected to the base of a first NPN transistor $Q_1$. A terminal 34 is connected to the base of a second NPN transistor $Q_2$. The emitters of the transistors $Q_1$, $Q_2$ are connected to the collector of a NPN transistor $Q_{18}$, whose emitter is connected through a resistor $R_{36}$ to the negative power source $-V_{EE}$, and whose base is connected to the collector of a NPN transistor $Q_{20}$. The base and emitter of the transistor $Q_{20}$ are respectively connected to the emitter of the transistor $Q_{18}$ and the negative power source $-V_{EE}$. The base of the transistor $Q_{18}$ is connected through a resistor $R_{37}$ to the cathode of the bias diode $D_{30}$, whose anode is connected to a positive power source $+V_{CC}$. The collectors of the transistors $Q_1$, $Q_2$ are respectively connected to PNP transistors $Q_3$, $Q_4$. The emitter of the transistor $Q_3$ is connected through a resistor $R_{38}$ to the collector of a PNP transistor $Q_5$. The emitter of the transistor $Q_4$ is connected through a resistor $R_{40}$ to the collector of the transistor $Q_5$, whose emitter is connected through a resistor $R_{42}$ to the positive power source $+V_{CC}$, and whose base is connected to the collector of a PNP transistor $Q_{24}$ whose base and emitter are respectively connected to the emitter of the transistor $Q_5$ and the positive power source $+V_{CC}$, and whose collector is connected to the base of a PNP transistor $Q_{22}$, whose emitter is connected through a resistor $R_{44}$ to the positive power source $+V_{CC}$, and whose collector is connected to the emitter of a PNP transistor $Q_0$. The base and collector of the PNP transistor $Q_0$ are respectively connected to the collector of the transistor $Q_{18}$ and negative power source $-V_{EE}$. The emitter of the transistor $Q_0$ is connected to a terminal 32, and the base thereof is connected to a terminal 36. The base of the transistor $Q_3$ is connected through a resistor $R_{30}$ to the cathode of the bias diode $D_{30}$. The base of the transistor $Q_4$ is connected through a resistor $R_{32}$ to a terminal 38. The base of the transistor $Q_5$ is connected through a resistor $R_{34}$ to the terminal 38, which is grounded through a capacitor $C_{10}$.

A bias circuit constituted by the transistor $Q_{24}$ corresponds to the bias diode $D_{20}$ of FIG. 3. A constant current circuit formed by the transistor $Q_{18}$ corresponds to the current source 18 of FIG. 2. The bias diode $D_{30}$ corresponds to the bias power source $3V_{BE}$ of FIG. 3 (In FIG. 5, however, voltage impussed by the diode $D_{30}$ corresponds to a level of $4V_{BE}$). The constant current supplied by the transistor $Q_5$ and the constant current absorbed by the transistor $Q_{18}$ are chosen to have substantially the same amount. The resistors $R_{38}$, $R_{40}$ are provided to decrease a differential gain in a differential circuit 50 consisting of the transistors $Q_3$, $Q_4$. The resistors $R_{38}$, $R_{40}$ are generally chosen to have the same level of resistance. However, said resistors $R_{38}$, $R_{40}$ need not have the same level of resistance.

Suppression of the differential gain of the differential circuit 50 has the advantage that where both transistors $Q_3$, $Q_4$ are rendered conducting, it is possible to broaden an allowable range of variations in an absolute value $|V_S-V_C|$ of a difference between the base potentials of said transistors $Q_3$, $Q_4$. Now let it be assumed that the transistors $Q_3$, $Q_4$ have a high current amplification factor $h_{FE}$ and the resistors $R_{38}$, $R_{40}$ are not used. Where, under such condition, it is desired to render both transistors $Q_3$, $Q_4$ conducting, it would be necessary to let the potential difference $|V_S-V_C|$ fall within the range of several to scores of mV units. The critical rigidity with which the operation point of the third and fourth transistors $Q_3$, $Q_4$ is to be defined could be alleviated by applying, for example, such type of the transistors $Q_3$, $Q_4$ as has a low current amplification factor $h_{FE}$ or providing the resistors $R_{38}$, $R_{40}$.

A control potential impressed on the terminal 38 is alternately short-circuited by the capacitor $C_{10}$. Even if, therefore, the control potential $V_C$ is accompanied with noises, the differential circuit 50 is not obstructed in operation by such noises.

FIG. 6 shows the arrangement of another modification of the signal switch circuit of FIG. 2. In this embodiment, two control voltages $V_{C1}$, $V_{C2}$ are applied to carry out the changeover and mixing of four input signals $e_{i11}$, $e_{i12}$, $e_{i21}$, $e_{i22}$. A terminal $30_1$ supplied with the input signal $e_{i11}$ is connected to the base of an NPN transistor $Q_{11}$. A terminal $34_1$ supplied with the input signal $e_{i21}$ is connected to the base of an NPN transistor $Q_{21}$. The emitters of the transistors $Q_{11}$, $Q_{21}$ are connected to the negative power source-$V_{EE}$ through a current source 18. The collectors of the transistors $Q_{11}$, $Q_{21}$ are respectively connected to the collectors of PNP transistor $Q_{31}$, $Q_{41}$. The emitters of the transistors $Q_{31}$, $Q_{41}$ are connected to the collector of a PNP transistor $Q_{51}$. The transistors $Q_{11}$, $Q_{21}$, $Q_{31}$, $Q_{41}$, $Q_{51}$ collectively constitute a first signal switch circuit.

A terminal $30_2$ supplied with the input signal $e_{i12}$ is connected to an NPN transistor $Q_{12}$. A terminal $34_2$ supplied with the input signal $e_{i22}$ is connected to the base of an NPN transistor $Q_{22}$. The emitters of the transistors $Q_{12}$, $Q_{22}$ are connected to the current source 18. The collectors of the transistors $Q_{12}$, $Q_{22}$ are respectively connected to the collectors of PNP transistors $Q_{32}$, $Q_{42}$, whose emitters are connected to the collector of a PNP transistor $Q_{52}$. The transistors $Q_{12}$, $Q_{22}$, $Q_{32}$, $Q_{42}$, $Q_{52}$ jointly constitute a second signal switch circuit.

The transistors $Q_{51}$, $Q_{52}$ are connected to a positive power source $+V_{CC}$ through the resistor $R_{18}$. The base of the transistor $Q_{51}$ is connected to the cathode of a bias diode $D_{50}$, whose anode is connected to the positive power source $+V_{CC}$, and whose cathode is connected to the anode of a bias diode $D_{52}$. The cathode of the bias diode $D_{52}$ is connected to the anode of a bias diode $D_{54}$ and the base of the transistor $Q_{31}$. The cathode of the bias diode $D_{54}$ is connected through a resistor $R_{50}$ to the negative power source $-V_{EE}$, and also to the base of the transistor $Q_{32}$. The bases of the transistors $Q_{51}$, $Q_{31}$, $Q_{32}$ are respectively supplied with comparison potentials $V_{S1}$, $V_{S2}$, $V_{S3}$ by the bias diodes $D_{50}$, $D_{52}$, $D_{54}$. The base of the transistor $Q_{52}$ is supplied with a first control potential $V_{C1}$ through a terminal $38_1$. The base of the transistor $Q_{42}$ is connected to a terminal $38_2$ through a resistor $R_{52}$. The base of the transistor $Q_{42}$ is connected to the base of the transistor $Q_{41}$ through a resistor $R_{54}$. The base of the transistor $Q_{41}$ is connected to the positive power source $+V_{CC}$ through a resistor $R_{56}$. The bases of the transistors $Q_{41}$, $Q_{42}$ are respectively supplied with control potentials $V_{C22}$, $V_{C23}$. The terminal $38_2$ is supplied with a second control potential $V_{C2}$. The D.C. levels of the potentials $V_{C22}$, $V_{C23}$ are changed in accordance with the D.C. levels of the second control potential $V_{C2}$. The emitters of the transistors $Q_{11}$, $Q_{21}$, $Q_{12}$, $Q_{22}$ are connected to a terminal 36, which sends forth a signal $e_0$ resulting from the changeover or mixing of input signals.

The embodiment of FIG. 6 is operated as follows.

(1) In case of $V_{S1} < V_{C1}$, the transistor $Q_{51}$ is rendered conducting, while the transistor $Q_{52}$ remains inoperative. Therefore, the first signal switch circuit alone is put into operation.

(1.1) In case of $V_{S2} < V_{C22}$, the transistor $Q_{31}$ is operated, while the transistor $Q_{41}$ is turned off. Therefore, the transistor $Q_{11}$ alone is rendered conducting, namely, $e_0 = e_{i11}$.

(1.2) In case of $V_{S2} = V_{C22}$, both transistors $Q_{31}$, $Q_{41}$ are rendered conducting, namely, $e_0 = e_{i11} + e_{i21}$.

(1.3) In case of $V_{S2} > V_{C22}$, the transistor $Q_{31}$ remains inoperative, while the transistor $Q_{41}$ is rendered conducting, namely, $e_0 = e_{i21}$.

(2) In case of $V_{S1} > V_{C1}$, the transistor $Q_{51}$ is turned inoperative, while the transistor $Q_{52}$ is rendered conducting. As a result, the second signal switch circuit alone is operated.

(2.1) In case of $V_{S3} < V_{C23}$, the transistor $Q_{32}$ is turned on, while the transistor $Q_{42}$ is rendered nonconducting, namely, $e_0 = e_{i12}$.

(2.2) In case of $V_{S3} = V_{C23}$, both transistors $Q_{32}$, $Q_{42}$ are rendered operative, namely, $e_0 = e_{i12} + e_{i22}$.

(2.3) In case of $V_{S3} > V_{C23}$, the transistor $Q_{32}$ remains inoperative, while the transistor $Q_{42}$ is put into operations, namely, $e_0 = e_{i22}$.

(3) In case of $V_{S1} = V_{C1}$, both transistors, $Q_{S1}$, $Q_{S2}$ are put into operation. As a result, both first and second signal switch circuits are rendered operative.

(3.1) In case of $V_{S2} < V_{C22}$ and $V_{S3} < V_{C23}$, both transistors $Q_{31}$, $Q_{32}$ are rendered conducting, namely, $e_0 = e_{i11} + e_{i12}$.

(3.2) In case of $V_{S2} = V_{C22}$ and $V_{S3} < V_{C23}$, the transistors $Q_{31}$, $Q_{41}$, $Q_{32}$ are operated, namely, $e_0 = e_{i11} + e_{i21} + e_{i12}$.

(3.3) In case of $V_{S2} > V_{C22}$ and $V_{S3} = V_{C23}$, the transistors $Q_{41}$, $Q_{32}$, $Q_{42}$ are operated, namely, $e_0 = e_{i21} + e_{i12} + e_{i22}$.

(3.4) In case of $V_{S2} > V_{C22}$ and $V_{S3} > V_{C23}$, both transistors $Q_{41}$, $Q_{42}$ are rendered conducting, namely, $e_0 = e_{i21} + e_{i22}$.

Two signal-switching modes, that is, a case (3.5) of $V_{S2} > V_{C22}$ and $V_{S3} < V_{C23}$ and a case (3.6) of $V_{S2} < V_{C22}$ and $V_{S3} > V_{C23}$ can also be realized in addition to the last mentioned four signal-switching modes (3.1) to (3.4). In this case, it is advised to reverse the mode of connecting the bases of the transistors $Q_{41}$, $Q_{42}$ from that indicated in FIG. 6, or change the control potentials $V_{C22}$, $V_{C23}$ independently.

As mentioned above, the embodiment of FIG. 6 makes it possible to carry out the changeover and mixing of a large number of input signals by means of the control potentials $V_{C1}$, $V_{C2}$. Further, where many of the signal switch circuits of FIG. 1 or 2 are assembled, the changeover and mixing of input signals can be carried out in the same manner as described above.

What is claimed is:

1. A signal switch circuit controlled by the D.C. level of a control signal, comprising:
   a first transistor having a base supplied with a first input signal, and an emitter for producing an output signal;
   a second transistor having a base supplied with a second input signal and an emitter connected to said first transistor emitter;
   a first switch circuit connected between the collector of said first transistor and a first power source, and actuated by first and second D.C. levels of said control signal;
   a second switch circuit connected between the collector of said second transistor and said first power source, and actuated by second and third D.C. levels of control signal; and
   a first impedance connected between a second power source and said first and second transistors emitters; and
   said first switch circuit being actuated by said first D.C. level to produce a signal at said first and second transistor emitters related to said first input signal, said second switch circuit being actuated by said third D.C. level to produce a signal at said first and second transistor emitters related to said second input signal, and said first and second switch circuits being actuated by said second D.C. level to produce a signal at said first and second transistor emitters related to a mixture of said first and second input signals.

2. A signal switch circuit according to claim 1, wherein:
said first switch circuit comprises a third transistor having a collector connected to said first transistor collector, a base supplied with a first potential, an emitter and a conductivity type opposite to that of said first transistor;
said second switch circuit comprises a fourth transistor having a collector connected to said second transistor collector, a base supplied with the D.C. potential of said control signal, an emitter, is connected to the first power source, and a conductivity type the same as that of said third transistor; and
said apparatus includes a second impedance means;
said third and fouth transistor emitters being connected to said first power source through said second impedance means.

3. A signal switch circuit controlled by a control signal comprising:
a first transistor having a base supplied with a first input signal and an emitter for producing an output signal;
a second transistor having a base supplied with a second input signal and an emitter connected to said first transistor emitter;
a first switch circuit connected between the collector of said first transistor and a first power source, and actuated by the D.C. level of said control signal, said first switch circuit including a third transistor having a collector connected to the collector of said first transistor, a base supplied with a first potential and a conductivity type opposite to that of said first transistor;
a first impedance connected to said first power source;
a second switch circuit connected between the collector of said second transistor and said first power source, and actuated by the D.C. level of said control signal, said second switch circuit including a fourth transistor having a collector connected to the collector of said second transistor, a base supplied with the D.C. potential of said control signal, an emitter, and a conductivity type the same as that of said third transistor, said third and fourth transistor emitters being connected to said first power source through said first impedance;
a second impedance connected between a second power source and said first and second transistor emitters;
a third impedance connected to said first power source;
a fifth transistor having a base connected to said emitters of said first and second transistors, a collector connected to said second power source, an emitter connected to said first power source through said third impedance, and a conductivity type opposite to that of said first and second transistors, said fifth transistor transmitting said output signal to prevent the operation point of said switch circuit from being affected by the D.C. level shift and temperature change ($\delta V_{BE}/\delta T$) of said first and second transistors which result from variations in the base-emitter threshold voltage of said first and second transistors.

4. A signal switch circuit controlled by a control signal comprising:
a first transistor having a base supplied with a first input signal, and an emitter for producing an output signal;
a second transistor having a base supplied with a second input signal and an emitter connected to said first transmitter emitter;
a first switch circuit connected between the collector of said first transistor and a first power source, and actuated by the D.C. level of said control signal, said first switch circuit including a third transistor having a collector connected to the collector of said first transistor, a base supplied with a first potential and a conductivity type opposite to that of said first transistor;
a first impedance connected to said first power source;
a second switch circuit connected between the collector of said second transistor and said first power source, and actuated by the D.C. level of said control signal, said second switch circuit including a fourth transistor having a collector connected to the collector of said second transistor, a base supplied with the D.C. potential of said control signal, an emitter and a conductivity type the same as that of said third transistor, said third and fourth transistor emitters being connected to one terminal of first and second resistors, respectively, the other terminal of both of said first and second resistors being connected to said first power source through said first impedance, said first and second resistors to alleviate the critical rigidity with which the switching point of said third and fourth transistors is to be defined; and
a second impedance connected between a second power source and said first and second transistor emitters.

5. A signal switch circuit controlled by at least one control signal comprising:
a first group of transistors, each of the bases of said first group of transistors being supplied with a first independent input signal, respectively, and each of the emitters of said first group of transistors being commonly connected to produce an output signal;
a second group of transistors, each of the bases of said second group of transistors being supplied with a second independent input signal, respectively, and each of the emitters of said second group of transistors being commonly connected to said first group emitters;
a first switch circuit means connected between the collectors of said first group of transistors and a first power source, and actuated by the D.C. level of said control signal;
a second switch circuit means connected between the collectors of said second group of transistors and the first power source, and actuated by the D.C. level of said control signal; and
a first impedance connected between a second power source and the emitters of said first and second groups.

6. A signal switch circuit according to claim 9, wherein:
said first switch circuit means includes a third group of transistors, each of the bases of said third group of transistors being supplied with a comparison potential, said comparison potentials being separated mutually; and
said second switch circuit means includes a fourth group of transistors, each of the bases of said third group of transistors being supplied with a control potential, said control potential being separated mutually.

* * * * *